(12) United States Patent
Feng et al.

(10) Patent No.: US 10,332,470 B2
(45) Date of Patent: Jun. 25, 2019

(54) SHIFT REGISTER UNIT AND METHOD OF DRIVING THE SAME, GATE DRIVING CIRCUIT AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Silin Feng, Beijing (CN); Xiujuan Wang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/695,191

(22) Filed: Sep. 5, 2017

(65) Prior Publication Data
US 2018/0090090 A1 Mar. 29, 2018

(30) Foreign Application Priority Data
Sep. 26, 2016 (CN) .......................... 2016 1 0852876

(51) Int. Cl.
*G09G 3/36* (2006.01)
*G11C 19/28* (2006.01)

(52) U.S. Cl.
CPC ......... *G09G 3/3677* (2013.01); *G09G 3/3622* (2013.01); *G09G 3/3674* (2013.01); *G11C 19/28* (2013.01); *G09G 2300/0408* (2013.01); *G09G 2300/0426* (2013.01); *G09G 2300/0852* (2013.01); *G09G 2310/0281* (2013.01); *G09G 2310/0286* (2013.01);
(Continued)

(58) Field of Classification Search
CPC .............. G09G 3/3674; G09G 3/3622; G09G 2310/0286; G09G 2310/0281; G09G 2300/0426; G09G 2300/0852; G09G 2310/061; G09G 2310/08; G09G 2300/0408; G11C 19/28; G11C 19/287
See application file for complete search history.

(56) References Cited

U.S. PATENT DOCUMENTS 9,294,086 B2 * 3/2016 Kwon .................. G09G 3/3266
9,530,375 B2 * 12/2016 Xiao .................... G09G 3/3648
9,729,146 B2 * 8/2017 Ahn ..................... H03K 17/284
(Continued)

*Primary Examiner* — Jose R Soto Lopez
(74) *Attorney, Agent, or Firm* — Brooks Kushman P.C.

(57) ABSTRACT

A shift register unit and a method of driving the same, a gate driving circuit and a display device are provided. The first pull-up circuit of the shift register is configured to output a signal of the first clock signal end to the first signal output end under a control of the pull-up node. The second pull-up circuit is configured to output the signal of the first clock signal end to the second signal output end under a control of the pull-up node. The first pull-down circuit is configured to pull down a potential of the pull-up node and a potential of the first signal output end to the potential of the second voltage end under a control of the pull-down node. The second pull-down circuit is configured to pull down a potential of the second signal output end to the potential of the second voltage end under a control of the pull-down node.

17 Claims, 5 Drawing Sheets

(52) U.S. Cl.
CPC ... *G09G 2310/061* (2013.01); *G09G 2310/08* (2013.01); *G11C 19/287* (2013.01)

(56) References Cited

U.S. PATENT DOCUMENTS

| | | | | |
|---|---|---|---|---|
| 9,830,845 B2* | 11/2017 | Lim | ........................ | G09G 3/20 |
| 2010/0007635 A1* | 1/2010 | Kwon | .................. | G09G 3/3677 |
| | | | | 345/204 |
| 2010/0141641 A1* | 6/2010 | Furuta | .................. | G11C 19/184 |
| | | | | 345/213 |
| 2011/0157263 A1* | 6/2011 | Kim | ..................... | G09G 3/3677 |
| | | | | 345/698 |
| 2011/0279429 A1* | 11/2011 | Kim | ..................... | G09G 3/3674 |
| | | | | 345/211 |
| 2012/0032937 A1* | 2/2012 | Koo | ..................... | G09G 3/3233 |
| | | | | 345/211 |
| 2012/0098800 A1* | 4/2012 | Kim | ..................... | G09G 3/3677 |
| | | | | 345/204 |
| 2012/0139883 A1* | 6/2012 | Lee | ....................... | G09G 3/3611 |
| | | | | 345/204 |
| 2012/0162187 A1* | 6/2012 | Lee | ........................ | G09G 3/007 |
| | | | | 345/212 |
| 2013/0038587 A1* | 2/2013 | Song | ........................ | G09G 5/18 |
| | | | | 345/211 |
| 2013/0265291 A1* | 10/2013 | Huang | ................ | G11C 19/287 |
| | | | | 345/212 |
| 2014/0092078 A1* | 4/2014 | Yoon | ....................... | G09G 5/001 |
| | | | | 345/212 |
| 2014/0192039 A1* | 7/2014 | Wang | .................... | G11C 19/28 |
| | | | | 345/213 |
| 2015/0317954 A1* | 11/2015 | Jang | ........................ | G09G 3/20 |
| | | | | 345/213 |
| 2016/0035303 A1* | 2/2016 | Kim | .................. | H01L 29/41733 |
| | | | | 345/206 |
| 2016/0217728 A1* | 7/2016 | In | ......................... | G09G 3/3275 |
| 2018/0061353 A1* | 3/2018 | Takeuchi | ............... | G11C 19/28 |
| 2018/0068631 A1* | 3/2018 | Abe | ........................ | G11C 19/28 |

* cited by examiner

SHIFT REGISTER UNIT AND METHOD OF DRIVING THE SAME, GATE DRIVING CIRCUIT AND DISPLAY DEVICE

CROSS-REFERENCE TO RELATED APPLICATION

This application claims priority to Chinese Patent Application No. 201610852876.8 filed on Sep. 26, 2016, which is incorporated herein by reference in its entirety.

TECHNICAL FIELD

The present disclosure relates to the field of display technology, and in particular to a shift register unit and a method of driving the same, a gate driving circuit and a display device.

BACKGROUND

A display such as a thin film transistor liquid crystal display (TFT-LCD) is provided with an array substrate. The array substrate is provided with a display region and a wire region at a periphery of the display region. A gate driver for scanning gate lines row by row is arranged at the periphery region. In the related art, a gate driver is commonly a Gate Driver on Array (GOA) where a thin film transistor (TFT) gate switching circuit is integrated to the periphery region to form a GOA circuit, so as to realize a narrow bezel.

In the related art, the GOA circuit includes a plurality of cascaded shift register units, and an output end OUT of each shift register unit is connected to one gate line to apply a gate driving signal to the gate line. When scanning the gate lines row by row, the gate driving signal received by the gate line G_n in the last row may be anamorphic seriously, and thus a driving ability of the GOA circuit may be reduced.

SUMMARY

The present disclosure provides in at least one embodiment a shift register unit and a method of driving the same, a gate driving circuit and a display device, so as to prevent the gate driving signal applied to the gate line by the shift register unit in one stage from interfering a waveform of a signal input to the shift register unit in the following stage.

To achieve the above objective, the present disclosure provides the following embodiments.

A shift register unit is provided in at least one embodiment of the present disclosure, including a pull-up control circuit, a first pull-up circuit, a second pull-up circuit, a pull-down control circuit, a first pull-down circuit, a second pull-down circuit, a reset circuit and a reconfiguration circuit, where the pull-up control circuit is connected to a first voltage end, a signal input end and a pull-up node, and is configured to output a voltage of the first voltage end to the pull-up node under a control of the signal input end; the first pull-up circuit is connected to a first clock signal end, a first signal output end and the pull-up node, and is configured to output a signal of the first clock signal end to the first signal output end under a control of the pull-up node; the second pull-up circuit is connected to the first clock signal end, a second signal output end and the pull-up node, and is configured to output the signal of the first clock signal end to the second signal output end under a control of the pull-up node; the pull-down control circuit is connected to a second clock signal end, the first clock signal end, the pull-up node, the pull-down node and a second voltage end, and is configured to pull down a potential of the pull-down node to a potential of the second voltage end under a control of the pull-up node, or output the signal of the first clock signal end to the pull-down node under a control of the first clock signal end, or output a signal of the second clock signal end to the pull-down node under a control of the second clock signal end; the first pull-down circuit is connected to the pull-down node, the pull-up node, the first signal output end and the second voltage end, and is configured to pull down a potential of the pull-up node and a potential of the first signal output end to the potential of the second voltage end under a control of the pull-down node; the reset circuit is connected to a reset signal end, the pull-up node, a third voltage end, and is configured to pull down the potential of the pull-up node to a potential of the third voltage end under a control of the reset signal end; and the reconfiguration circuit is connected to the second clock signal end, the second voltage end, the first signal output end and the second signal output end, and is configured to pull down the potential of the first signal output end and the potential of the second signal output end to the potential of the second voltage end under a control of the second clock signal end.

Optionally, the pull-up control circuit includes a first transistor, a gate electrode of the first transistor is connected to the signal input end, a first electrode of the first transistor is connected to the first voltage end, and a second electrode of the first transistor is connected to the pull-up node.

Optionally, the first pull-up circuit includes a second transistor and a third transistor; a gate electrode of the second transistor is connected to the pull-up node, a first electrode of the second transistor is connected to the first clock signal end, and a second electrode of the second transistor is connected to the first signal output end; and a gate electrode and a second electrode of the third transistor are connected to the first signal output end, and the second electrode of the third transistor is connected to the first clock signal end.

Optionally, the second pull-up circuit includes a fourth transistor and a storage capacitor; a gate electrode of the fourth transistor is connected to the pull-up node, a first electrode of the fourth transistor is connected to the first clock signal end, and a second electrode of the fourth transistor is connected to the second signal output end; and two ends of the storage capacitor are respectively connected to the fourth transistor and the second signal output end.

Optionally, the pull-down control circuit includes a fifth transistor, a sixth transistor and a seventh transistor; a gate electrode and a first electrode of the fifth transistor are connected to the second clock signal end, and a second electrode of the fifth transistor is connected to the pull-down node; a gate electrode and a first electrode of the sixth transistor are connected to the first clock signal end, and a second electrode of the sixth transistor is connected to the pull-down node; and a gate electrode of the seventh transistor is connected to the pull-up node, a first electrode of the seventh transistor is connected to the second voltage end, and a second electrode of the seventh transistor is connected to the pull-down node.

Optionally, the first pull-down circuit includes an eighth transistor and a ninth transistor; a gate electrode of the eighth transistor is connected to the pull-down node, a first electrode of the eighth transistor is connected to the second voltage end, and a second electrode of the eighth transistor is connected to the pull-up node; and a gate electrode of the ninth transistor is connected to the pull-down node, a first electrode of the ninth transistor is connected to the second voltage end, and a second electrode of the ninth transistor is connected to the first signal output end.

Optionally, the second pull-down circuit includes a tenth transistor, a gate electrode of the tenth transistor is connected to the pull-down node, a first electrode of the tenth transistor is connected to the second voltage end, and a second electrode of the tenth transistor is connected to the second signal output end.

Optionally, the reset circuit includes an eleventh transistor; a gate electrode of the eleventh transistor is connected to the reset signal end, a first electrode of the eleventh transistor is connected to the third voltage end, and a second electrode of the eleventh transistor is connected to the pull-up node.

Optionally, the reconfiguration circuit includes a twelfth transistor and a thirteenth transistor; a gate electrode of the twelfth transistor is connected to the second clock signal end, a first electrode of the twelfth transistor is connected to the second voltage end, and a second electrode of the twelfth transistor is connected to the second signal output end; and a gate electrode of the thirteenth transistor is connected to the second clock signal end, a first electrode of the thirteenth transistor is connected to the second voltage end, and a second electrode of the thirteenth transistor is connected to the first signal output end.

A gate driving circuit is further provided in at least one embodiment of the present disclosure, configured to apply gate driving signals to gate lines respectively and including the above shift register units which are connected to each other in a cascaded manner, where a first signal output end of the shift register unit in each stage is connected to the gate line; excepting the shift register unit in a first stage, a second signal output end of the shift register unit in a current stage is connected to a signal input end of the shift register unit in a following stage; excepting the shift register unit in a last stage, the second signal output end of the shift register unit in a current stage is connected to a reset signal end of the shift register unit in a previous stage; and the signal input end of the shift register unit in the first stage and the reset signal end of the shift register unit in the last stage are connected to an initial signal end.

A display device is further provided in at least one embodiment of the present disclosure, including the above gate driving circuit.

A method of driving the above shift register unit is further provided in at least one embodiment of the present disclosure, within one frame of image, the method includes: the reconfiguration circuit pulling down a potential of the first signal output end and a potential of the second signal output end to a potential of the second voltage end under a control of the second clock signal end, in a first sub-phase of an initialization phase; outputting a voltage of the first clock signal end to the pull-down node through the pull-down control circuit under a control of the first clock signal end, the first pull-down circuit pulling down a potential of the pull-down node and a potential of the first signal output end to a potential of the second voltage end under a control of the pull-down node, and the second pull-down circuit pulling down a potential of the second signal output end to the potential of the second voltage end under a control of the pull-down node, in a second sub-phase of the initialization phase; the pull-up control circuit outputting a voltage of the first voltage end to the pull-up node and storing the voltage of the first voltage end into the second pull-up circuit under a control of the signal input end, in an input phase; under a control of the pull-up node, the first pull-up circuit outputting the voltage of the first clock signal end to the first signal output end and the second pull-up circuit outputting the voltage of the first clock signal end to the second signal output end, in an output phase; the reset circuit pulling down a potential of the pull-up node to a potential of the third voltage end under a control of the reset signal end, the pull-down control circuit outputting a voltage of the second clock signal end to the pull-down node under a control of the second clock signal end, the first pull-down circuit pulling down the potential of the pull-up node and the potential of the first signal output end to the potential of the second voltage end under a control of the pull-down node, and the second pull-down circuit pulling down the potential of the second signal output end to the potential of the second voltage end, in a reset phase; and repeating the initialization phase prior to a following frame of image.

Optionally, the reconfiguration circuit pulling down the potential of the first signal output end and the potential of the second signal output end to the potential of the second voltage end under the control of the second clock signal end in the first sub-phase of the initialization phase includes: in the case that transistors of the pull-up control circuit, the first pull-up circuit, the second pull-up circuit, the pull-down control circuit, the first pull-down circuit, the second pull-down circuit, the reset circuit and the reconfiguration circuit are N-type transistors, under a control of the second clock signal end, cutting in the twelfth transistor and the thirteenth transistor, pulling down the potential of the second signal output end to the potential of the second voltage end through the twelfth transistor, and pulling down the potential of the first signal output end to the potential of the second voltage end through the thirteenth transistor.

Optionally, the outputting the voltage of the first clock signal end to the pull-down node through the pull-down control circuit under a control of the first clock signal end, the first pull-down circuit pulling down the potential of the pull-down node and the potential of the first signal output end to the potential of the second voltage end under a control of the pull-down node, and the second pull-down circuit pulling down the potential of the second signal output end to the potential of the second voltage end under a control of the pull-down node in the second sub-phase of the initialization phase includes: in the case that transistors of the pull-up control circuit, the first pull-up circuit, the second pull-up circuit, the pull-down control circuit, the first pull-down circuit, the second pull-down circuit, the reset circuit and the reconfiguration circuit are N-type transistors, cutting in the sixth transistor and applying a high level output by the first clock signal end to the pull-down node under a control of the first clock signal end, cutting in the eighth transistor, the ninth transistor and the tenth transistor under a control of the pull-down node, pulling down the potential of the pull-up node to the potential of the second voltage end through the eighth transistor, pulling down the potential of the second signal output end to the potential of the second voltage end through the tenth transistor, and pulling down the potential of the first signal output end to the potential of the second voltage end through the ninth transistor.

Optionally, the pull-up control circuit outputting the voltage of the first voltage end to the pull-up node and storing the voltage of the first voltage end into the second pull-up circuit under a control of the signal input end in the input phase includes: in the case that transistors of the pull-up control circuit, the first pull-up circuit, the second pull-up circuit, the pull-down control circuit, the first pull-down circuit, the second pull-down circuit, the reset circuit and the reconfiguration circuit are N-type transistors, applying a high level to the signal input end, cutting in the first transistor, outputting a high level of the first voltage end to the pull-up node, and storing the high level of the first voltage end.

Optionally, the first pull-up circuit outputting the voltage of the first clock signal end to the first signal output end and the second pull-up circuit outputting the voltage of the first clock signal end to the second signal output end under a control of the pull-up node in the output phase includes: in the case that transistors of the pull-up control circuit, the first pull-up circuit, the second pull-up circuit, the pull-down control circuit, the first pull-down circuit, the second pull-down circuit, the reset circuit and the reconfiguration circuit are N-type transistors, applying a low level to the signal input end and cutting off the first transistor; pulling up the potential of the pull-up node; cutting in the fourth transistor and the second transistor under a control of the pull-up node; applying a high level output by the first clock signal end to the second signal output end through the fourth transistor, to enable the second signal output end to output a signal to the signal input end of the shift register unit in a following stage; and applying the high level output by the first clock signal end to the first signal output end through the second transistor, to cut in the third transistor.

Optionally, the reset circuit pulling down a potential of the pull-up node to a potential of the third voltage end under a control of the reset signal end, the pull-down control circuit outputting a voltage of the second clock signal end to the pull-down node under a control of the second clock signal end, the first pull-down circuit pulling down the potential of the pull-up node and the potential of the first signal output end to the potential of the second voltage end under a control of the pull-down node, and the second pull-down circuit pulling down the potential of the second signal output end to the potential of the second voltage end in a reset phase includes: in the case that transistors of the pull-up control circuit, the first pull-up circuit, the second pull-up circuit, the pull-down control circuit, the first pull-down circuit, the second pull-down circuit, the reset circuit and the reconfiguration circuit are N-type transistors, applying a high level to the reset signal end; cutting in the first transistor; and pulling down the potential of the pull-up node to the potential of the third voltage end to reset the pull-up node and cut off the second transistor, the third transistor and the fourth transistor.

According to the shift register unit and the method of driving the same, the gate driving circuit and the display device, the shift register unit includes a pull-up control circuit, a first pull-up circuit, a second pull-up circuit, a pull-down control circuit, a first pull-down circuit, a second pull-down circuit, a reset circuit and a reconfiguration circuit, where the pull-up control circuit is connected to a first voltage end, a signal input end and a pull-up node, and is configured to output a voltage of the first voltage end to the pull-up node under a control of the signal input end; the first pull-up circuit is connected to a first clock signal end, a first signal output end and the pull-up node, and is configured to output a signal of the first clock signal end to the first signal output end under a control of the pull-up node; the second pull-up circuit is connected to the first clock signal end, a second signal output end and the pull-up node, and is configured to output the signal of the first clock signal end to the second signal output end under a control of the pull-up node; the pull-down control circuit is connected to a second clock signal end, the first clock signal end, the pull-up node, the pull-down node and a second voltage end, and is configured to pull down a potential of the pull-down node to a potential of the second voltage end under a control of the pull-up node, or output the signal of the first clock signal end to the pull-down node under a control of the first clock signal end, or output a signal of the second clock signal end to the pull-down node under a control of the second clock signal end; the first pull-down circuit is connected to the pull-down node, the pull-up node, the first signal output end and the second voltage end, and is configured to pull down a potential of the pull-up node and a potential of the first signal output end to the potential of the second voltage end under a control of the pull-down node; the reset circuit is connected to a reset signal end, the pull-up node, a third voltage end, and is configured to pull down the potential of the pull-up node to a potential of the third voltage end under a control of the reset signal end; and the reconfiguration circuit is connected to the second clock signal end, the second voltage end, the first signal output end and the second signal output end, and is configured to pull down the potential of the first signal output end and the potential of the second signal output end to the potential of the third voltage end under a control of the second clock signal end.

Therefore, when forming the gate driving circuit by the cascaded shift register units hereinabove, the first signal output end connected to the first pull-up circuit may be connected to the gate line, so as to apply a gate driving signal to the gate line. The second signal output end connected to the second pull-up circuit may be connected to a signal input end of the shift register unit in the following stage to apply an input signal to the signal input end. Because the first signal output end and the second signal output end may be controlled independently through the first pull-up circuit and the second pull-up circuit respectively, the first signal output end and the second signal output end may be two independent signal output ends, so that it is able to prevent the signal output from the first signal output end from interfering the signal output from the second signal output end, and a cascade relationship between two adjacent shift register units may be weakened, so as to reduce a probability of a delay of the signal received by the signal input end of the shift register unit.

BRIEF DESCRIPTION OF THE DRAWINGS

In order to illustrate the present disclosure and the related art clearly, the drawings relating to the present disclosure or the related art will be described briefly. Obviously, the following drawings merely relate to a part of, rather than all of, the embodiments of the present disclosure, and based on these embodiments, a person skilled in the art may, without any creative effort, obtain the other embodiments, which also fall within the scope of the present disclosure.

FIG. 1b shows a delay of gate scanning signal of the gate driving circuit shown in FIG. 1a;

DRAWING REFERENCES

Figure 1A:
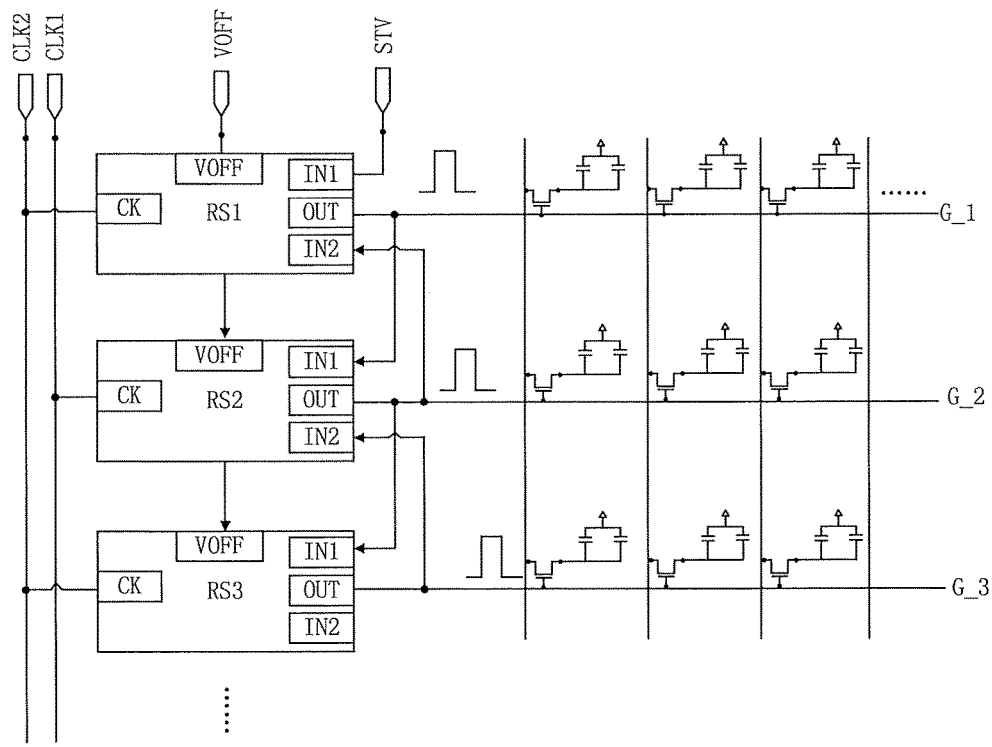
FIG. 1a is a schematic view of a gate driving circuit in the related art.

10: pull-up control circuit
20: first pull-up circuit

30: second pull-up circuit
40: pull-down control circuit
50: first pull-down circuit
60: second pull-down circuit
70: reset circuit
80: reconfiguration circuit

DETAILED DESCRIPTION

The present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1B:
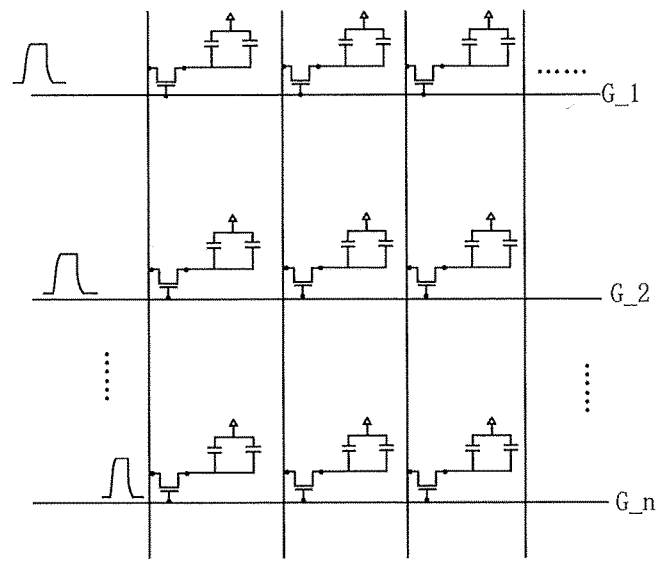

In the related art, the GOA circuit is as shown in FIG. 1a, which includes a plurality of cascaded shift register units (shift register unit RS1, shift register unit RS2, shift register unit RS3 . . . ), and an output end OUT of each shift register unit is connected to one gate line (G_1, G_2 or G_3) to apply a gate driving signal to the gate line. A signal output from an output end OUT of a shift register unit in a previous stage serves an input signal of a shift register unit in a following stage. Because the gate line in each row is connected to sub-pixels in the same row, and each sub-pixel is provided with a TFT, a liquid crystal capacitor and a stray capacitor, the above components may cause a delay of the signal output from the output end OUT to the input end of the shift register unit in the following stage. As a result, as shown in FIG. 1b, time length of both a rising edge and a falling edge of the gate driving signal may be increased. Therefore, when scanning the gate lines row by row, the above signal delay may be accumulated by rows, the gate driving signal received by the gate line G_n in the last row may be anamorphic seriously, and thus a driving ability of the GOA circuit may be reduced.

Figure 2:
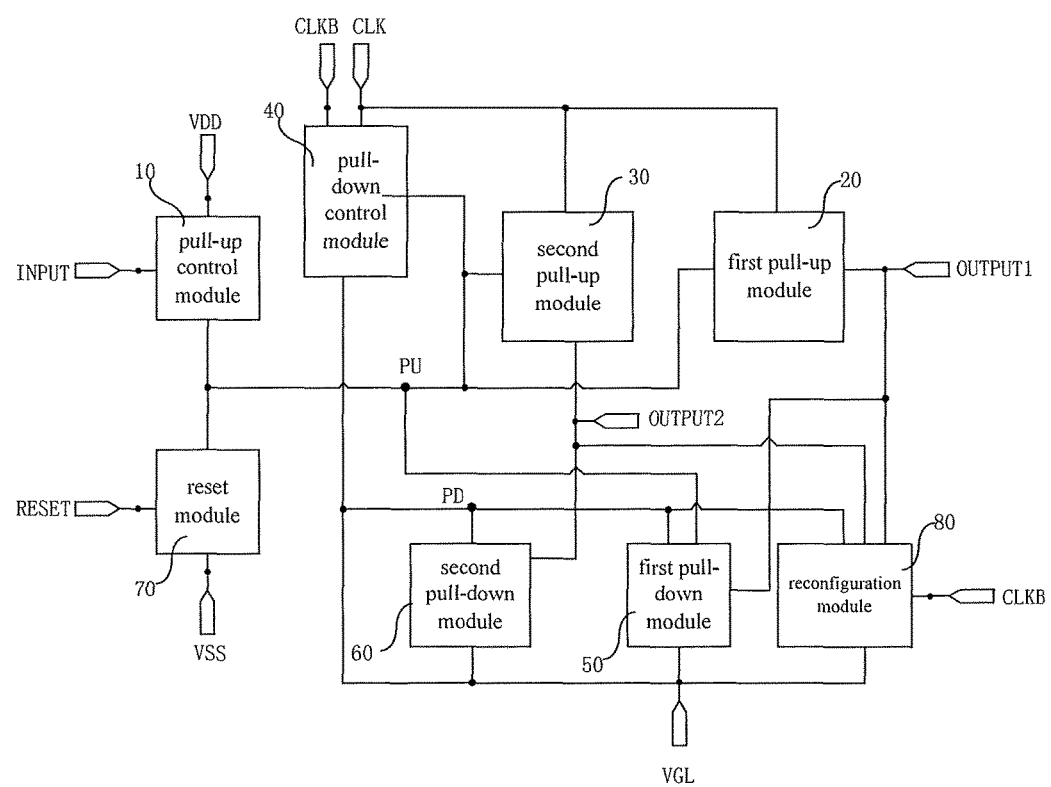
FIG. 2 is a schematic view of a shift register unit in at least one embodiment of the present disclosure.

A shift register unit is provided in at least one embodiment of the present disclosure. As shown in FIG. 2, the shift register unit RS includes a pull-up control circuit 10, a first pull-up circuit 20, a second pull-up circuit 30, a pull-down control circuit 40, a first pull-down circuit 50, a second pull-down circuit 60, a reset circuit 70 and a reconfiguration circuit 80.

The pull-up control circuit 10 is connected to a first voltage end VDD, a signal input end INPUT and a pull-up node PU, and is configured to output a voltage of the first voltage end VDD to the pull-up node PU under a control of the signal input end INPUT.

The first pull-up circuit 20 is connected to a first clock signal end CLK, a first signal output end OUTPUT1 and the pull-up node PU, and is configured to output a signal of the first clock signal end CLK to the first signal output end OUTPUT1 under a control of the pull-up node PU.

The second pull-up circuit 30 is connected to the first clock signal end CLK, a second signal output end OUTPUT2 and the pull-up node PU, and is configured to output the signal of the first clock signal end CLK to the second signal output end OUTPUT2 under a control of the pull-up node PU.

The pull-down control circuit 40 is connected to a second clock signal end CLKB, the first clock signal end CLK, the pull-up node PU, the pull-down node PD and a second voltage end VGL, and is configured to pull down a potential of the pull-down node PD to a potential of the second voltage end VGL under a control of the pull-up node PU, or output the signal of the first clock signal end CLK to the pull-down node PD under a control of the first clock signal end CLK, or output a signal of the second clock signal end CLKB to the pull-down node PD under a control of the second clock signal end CLKB.

The second pull-down circuit 60 is connected to the pull-down node PD, the second signal output end OUTPUT2 and the second voltage end VGL, and is configured to pull down a potential of the second signal output end OUTPUT2 to the potential of the second voltage end VGL under a control of the pull-down node PD.

The first pull-down circuit 50 is connected to the pull-down node PD, the pull-up node PU, the first signal output end OUTPUT1 and the second voltage end VGL, and is configured to pull down a potential of the pull-up node PU and a potential of the first signal output end OUTPUT1 to the potential of the second voltage end VGL under a control of the pull-down node PD.

The reset circuit 70 is connected to a reset signal end RESET, the pull-up node PU and a third voltage end VSS, and is configured to pull down the potential of the pull-up node PU to a potential of the third voltage end VSS under a control of the reset signal end RESET.

The reconfiguration circuit 80 is connected to the second clock signal end CLKB, the second voltage end VGL, the first signal output end OUTPUT1 and the second signal output end OUTPUT2, and is configured to pull down the potential of the first signal output end OUTPUT1 and the potential of the second signal output end OUTPUT2 to the potential of the second voltage end VGL under a control of the second clock signal end CLKB, so as to reconfigure the potential of the first signal output end OUTPUT1 and second signal output end OUTPUT2.

Therefore, when forming the gate driving circuit by the cascaded shift register units hereinabove, the first signal output end connected to the first pull-up circuit may be connected to the gate line, so as to apply a gate driving signal to the gate line. The second signal output end connected to the second pull-up circuit may be connected to a signal input end of the shift register unit in the following stage to apply an input signal to the signal input end. Because the first signal output end and the second signal output end may be controlled independently through the first pull-up circuit and the second pull-up circuit respectively, the first signal output end and the second signal output end may be two independent signal output ends, so that it is able to prevent the signal output from the first signal output end from interfering the signal output from the second signal output end, and a cascade relationship between two adjacent shift register units may be weakened, so as to reduce a probability of a delay of the signal received by the signal input end of the shift register unit.

The structures of the above circuits will be described in details hereinafter.

Figure 3:
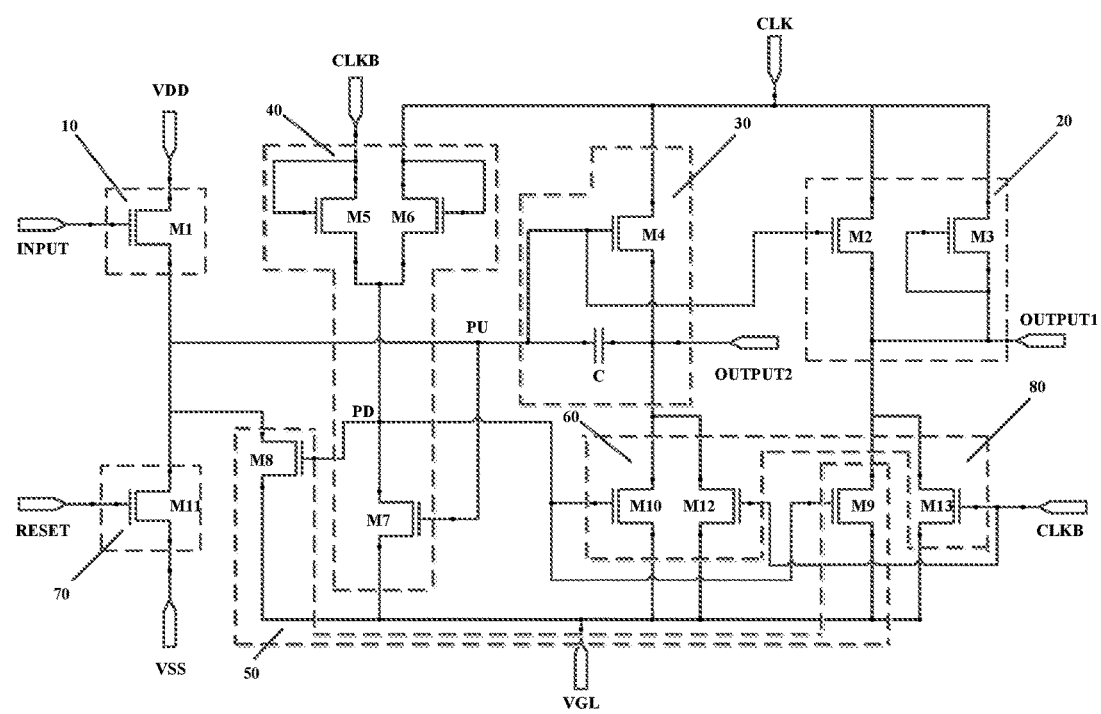
FIG. 3 is a schematic view of the circuits shown in FIG. 2.

To be specific, as shown in FIG. 3, the pull-up control circuit 10 includes a first transistor M1, a gate electrode of the first transistor M1 is connected to the signal input end INPUT, a first electrode of the first transistor M1 is connected to the first voltage end VDD, and a second electrode of the first transistor M1 is connected to the pull-up node PU.

The first pull-up circuit 20 includes a second transistor M2 and a third transistor M3. A gate electrode of the second transistor M2 is connected to the pull-up node PU, a first electrode of the second transistor M2 is connected to the first clock signal end CLK, and a second electrode of the second transistor M2 is connected to the first signal output end OUTPUT1.

A gate electrode and a first electrode of the third transistor M3 are connected to the first signal output end OUTPUT1, and a second electrode of the third transistor M3 is connected to the first clock signal end CLK.

It should be noted that, when the first pull-up circuit 20 only includes the second transistor M2, the first pull-up circuit 20 is also able to output a signal output by the first clock signal end CLK to the first signal output end OUTPUT1 in the case that the second transistor M2 is cut in. However, when the first pull-up circuit 20 includes both the second transistor M2 and the third transistor M3, both the second transistor M2 and the third transistor M3 may serve as the driving transistors, so as to cut in the second transistor M2 and the third transistor M3 simultaneously to output the gate scanning signal to the gate line connected to the first signal output end OUTPUT1, thereby improving the driving ability of the gate scanning signal.

In addition, the second pull-up circuit 30 includes a fourth transistor M4 and a storage capacitor C.

A gate electrode of the fourth transistor M4 is connected to the pull-up node PU, a first electrode of the fourth transistor M4 is connected to the first clock signal end CLK, and a second electrode of the fourth transistor M4 is connected to the second signal output end OUTPUT2.

Two ends of the storage capacitor C are respectively connected to the fourth transistor M4 and the second signal output end OUTPUT2.

The pull-down control circuit 40 includes a fifth transistor M5, a sixth transistor M6 and a seventh transistor M7.

A gate electrode and a first electrode of the fifth transistor M5 are connected to the second clock signal end CLKB, and a second electrode of the fifth transistor M5 is connected to the pull-down node PD.

A gate electrode and a first electrode of the sixth transistor M6 are connected to the first clock signal end CLK, and a second electrode of the sixth transistor M6 is connected to the pull-down node PD.

A gate electrode of the seventh transistor M7 is connected to the pull-up node PU, a first electrode of the seventh transistor M7 is connected to the second voltage end VGL, and a second electrode of the seventh transistor M7 is connected to the pull-down node PD.

The first pull-down circuit 50 includes an eighth transistor M8 and a ninth transistor M9.

A gate electrode of the eighth transistor M8 is connected to the pull-down node PD, a first electrode of the eighth transistor M8 is connected to the second voltage end VGL, and a second electrode of the eighth transistor M8 is connected to the pull-up node PU.

A gate electrode of the ninth transistor M9 is connected to the pull-down node PD, a first electrode of the ninth transistor M9 is connected to the second voltage end VGL, and a second electrode of the ninth transistor M9 is connected to the first signal output end OUTPUT1.

The second pull-down circuit 60 includes a tenth transistor M10, a gate electrode of the tenth transistor M10 is connected to the pull-down node PD, a first electrode of the tenth transistor M10 is connected to the second voltage end VGL, and a second electrode of the tenth transistor M10 is connected to the second signal output end OUTPUT2.

The reset circuit 70 includes an eleventh transistor M11.

A gate electrode of the eleventh transistor M11 is connected to the reset signal end RESET, a first electrode of the eleventh transistor M11 is connected to the third voltage end VSS, and a second electrode of the eleventh transistor M11 is connected to the pull-up node PU.

The reconfiguration circuit 80 includes a twelfth transistor M12 and a thirteenth transistor M13.

A gate electrode of the twelfth transistor M12 is connected to the second clock signal end CLKB, a first electrode of the twelfth transistor M12 is connected to the second voltage end VGL, and a second electrode of the twelfth transistor M12 is connected to the second signal output end OUTPUT2.

A gate electrode of the thirteenth transistor M13 is connected to the second clock signal end CLKB, a first electrode of the thirteenth transistor M13 is connected to the second voltage end VGL, and a second electrode of the thirteenth transistor M13 is connected to the first signal output end OUTPUT1.

It should be noted that, the above transistors may be N-type transistors or P-type transistors. The first electrode of each of the above transistors may be a source electrode and the second electrode thereof may be a drain electrode, or the first electrode of each of the above transistors may be a drain electrode and the second electrode thereof may be a source electrode, and that is not limited herein.

Figure 4:
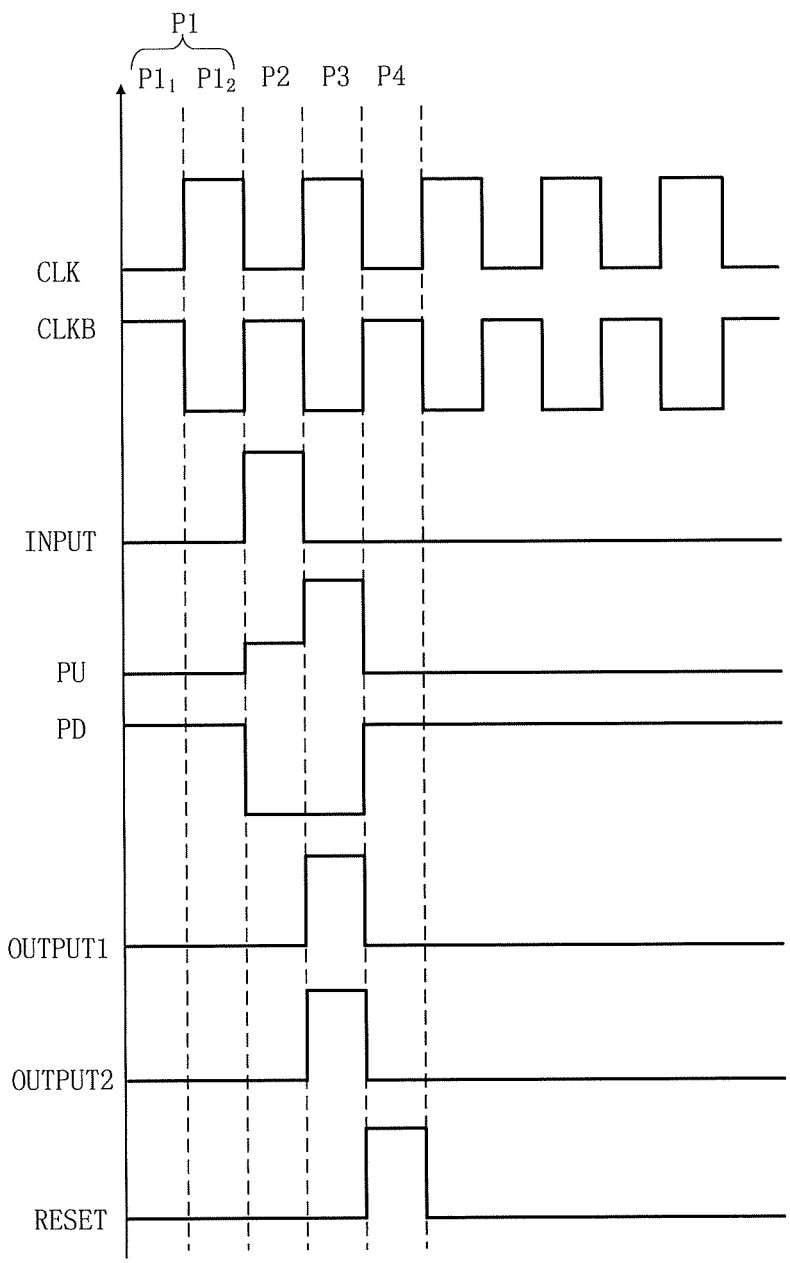
FIG. 4 is a schematic view of a time sequence of a signal for controlling the shift register unit shown in FIG. 3.
Figure 5:
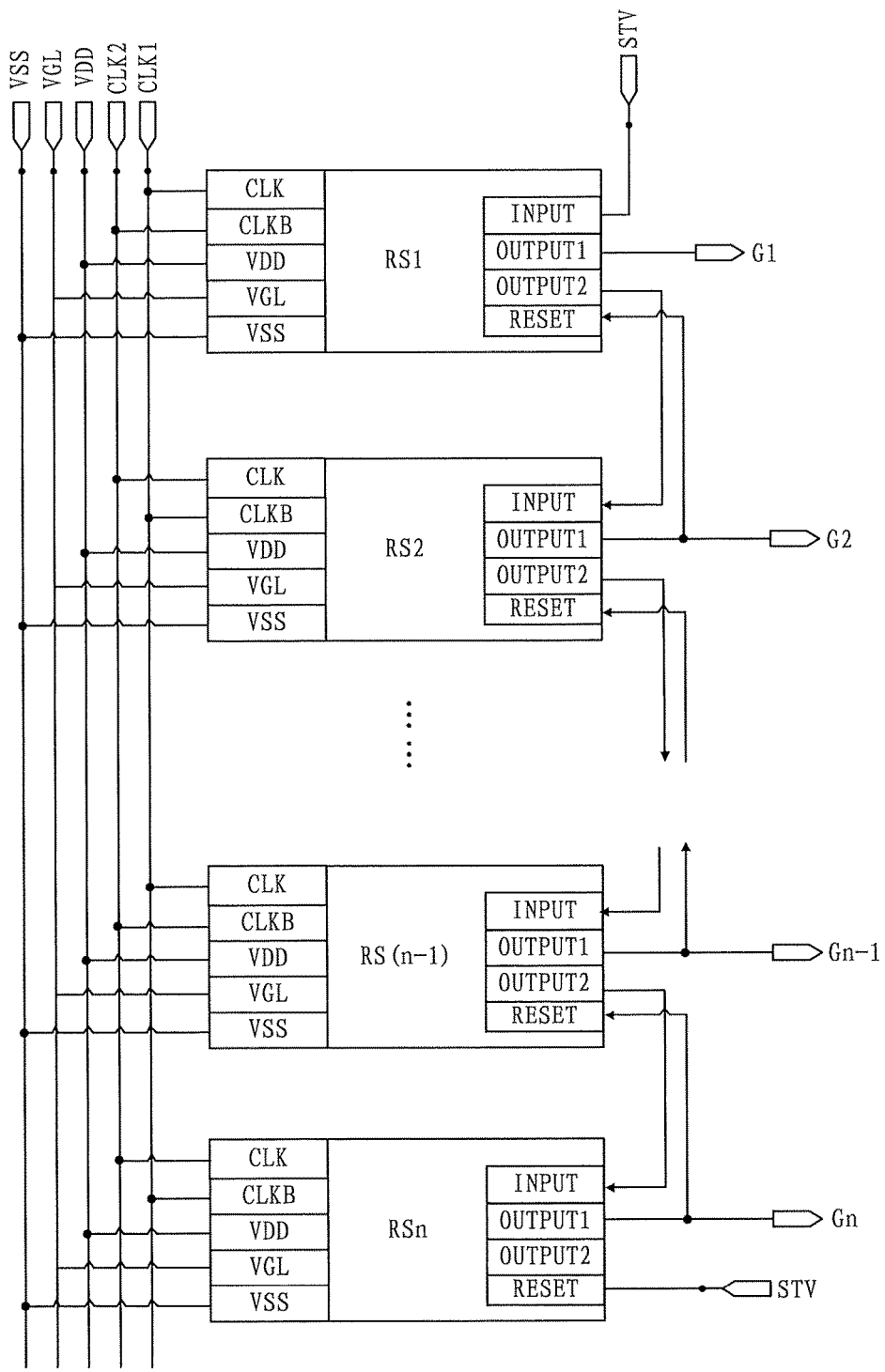
FIG. 5 is a schematic view of a gate driving circuit in at least one embodiment of the present disclosure.

Taking an example that the above transistors are N-type transistors, as shown in FIG. 4 and FIG. 5, and referring to FIG. 4 and FIG. 5 which show the cut-in and cut-off the transistors of the shift register unit in respective phase (initialization phase P1-reset phase P4) of one image frame, the embodiments of the present disclosure will be described. In at least one embodiment of the present disclosure, the first voltage end VDD output a high level, and the second voltage end VGL and the third voltage end VSS output low levels.

In this case, in a first sub-phase P11 of an initialization phase P1 as shown in FIG. 4, CLK=0, CLKB=1, INPUT=0, RESET=0, where "0" represents a low level and "1" represents a high level.

At this time, the twelfth transistor M12 and the thirteenth transistor M13 are cut in, the potential of the second signal output end OUTPUT2 is pulled down to the potential of the second voltage end VGL through the twelfth transistor M12, and the potential of the first signal output end OUTPUT1 is pulled down to the potential of the second voltage end VGL through the thirteenth transistor M13. Therefore, the potential of the first signal output end OUTPUT1 and the second signal output end OUTPUT2 may be reset in the first sub-phase P11 of the initialization phase P1, so as to prevent the remained signal of the previous image frame from interfering the output signal of the current image frame.

In addition, the first clock signal end CLK output a high level to cut in the fifth transistor M5, so as to apply a high level output by the first clock signal end CLK to the pull-down node PD. The eighth transistor M8, the ninth transistor M9 and the tenth transistor M10 are cut in under a control of the pull-down node PD, the potential of the pull-up node PU is pulled down to the potential of the second voltage end VGL through the eighth transistor M8, the potential of the second signal output end OUTPUT2 is pulled down to the potential of the second voltage end VGL through the tenth transistor M10, and the potential of the first signal output end OUTPUT1 is pulled down to the potential of the second voltage end VGL through the ninth transistor M9.

It should be noted that, in the first sub-phase P11 of the initialization phase P1, the transistors of the shift register unit other than the above cut-in transistors are cut-off.

As shown in FIG. 4, in a second sub-phase P12 of the initialization phase P1, CLK=1, CLKB=0, INPUT=0, and RESET=0.

In this case, the eighth transistor M8, the ninth transistor M9 and the tenth transistor M10 are cut in under a control of the pull-down node PD, the potential of the pull-up node PU is pulled down to the potential of the second voltage end VGL through the eighth transistor M8, the potential of the second signal output end OUTPUT2 is pulled down to the potential of the second voltage end VGL through the tenth transistor M10, and the potential of the first signal output end OUTPUT1 is pulled down to the potential of the second voltage end VGL through the ninth transistor M9.

It should be noted that, in the second sub-phase P12 of the initialization phase P1, the transistors of the shift register unit other than the above cut-in transistors are cut-off.

To sum up, in the initialization phase P1, the potential of the first signal output end OUTPUT1 and the second signal output end OUTPUT2 are pulled down to the low level of the second voltage end VGL, so as to prevent a mal-output of the first signal output end OUTPUT1 and the second signal output end OUTPUT2 in this phase.

As shown in FIG. 4, in an input phase P2, CLK=0, CLKB=1, INPUT=1 and RESET=0.

In this case, a high level is applied to the signal input end INPUT, the first transistor M1 is cut in, a high level of the first voltage end VDD is output to the pull-up node PU, and the high level of the first voltage end VDD is stored by the storage capacitor C. The fourth transistor M4 and the second transistor M2 are cut in under a control of the pull-up node PU. A low level output by the first clock signal end CLK is applied to the second signal output end OUTPUT2 through the fourth transistor M4. A low level output by the first clock signal end CLK is applied to the first signal output end OUTPUT1 through the second transistor M2, to cut off the third transistor M3.

In addition, under a control of the pull-up node PU, the seventh transistor M7 is cut in, and the potential of the pull-down node PD is pulled down to the potential of the second voltage end VGL. At this time, the eighth transistor M8, the tenth transistor M10 and the ninth transistor M9 are cut off. The second clock signal end CLKB outputs a high level, and the fifth transistor M5, the twelfth transistor M12 and the thirteenth transistor M13 are cut in, the potential of the second signal output end OUTPUT2 is pulled down to the potential of the second voltage end VGL through the twelfth transistor M12, and the potential of the first signal output end OUTPUT1 is pulled down to the potential of the second voltage end VGL through the thirteenth transistor M13. Although the high level output by the second clock signal end CLKB may be applied to the pull-down node PD through the fifth transistor M5, since the seventh transistor M7 is cut in, the potential of the pull-down node PD may be pulled down to the potential of the second voltage end VGL.

Based on this, the reset signal end RESET outputs a low level, and the eleventh transistor M11 is cut off. In addition, the first clock signal end CLK outputs a low level, so the sixth transistor M6 is cut off.

As shown in FIG. 4, in an output phase P3, CLK=1, CLKB=0, INPUT=0 and RESET=0.

In this case, a low level is applied to the signal input end INPUT and the first transistor M1 is cut off, the potential of the pull-up node PU may be further pulled up due to a bootstrapping of the storage capacitor C. The fourth transistor M4 and the second transistor M2 are cut in under a control of the pull-up node PU. A high level output by the first clock signal end CLK is applied to the second signal output end OUTPUT2 through the fourth transistor M4, to enable the second signal output end OUTPUT2 to output a signal to the signal input end INPUT of the shift register unit RS in a following stage. In addition, the high level output by the first clock signal end CLK is applied to the first signal output end OUTPUT1 through the second transistor M2, and then the third transistor M3 is cut in, so as to apply the high level output by the first clock signal end CLK to the first signal output end OUTPUT1, thereby improving a driving ability of the gate scanning signal output by the first signal output end OUTPUT1.

In addition, under a control of the pull-up node PU, the seventh transistor M7 is cut in, and the potential of the pull-down node PD is pulled down to the potential of the second voltage end VGL. At this time, the eighth transistor M8, the tenth transistor M10 and the ninth transistor M9 are cut off.

The first clock signal end CLK outputs a high level and the sixth transistor M6 is cut in, and the high level output by the first clock signal end CLK is applied to the pull-down node PD. However, since the seventh transistor M7 is cut in, the potential of the pull-down node PD may be pulled down to the potential of the second voltage end VGL.

Based on this, the second clock signal end CLKB outputs a low level, and the fifth transistor M5, the twelfth transistor M12 and the thirteenth transistor M13 are cut off. The reset signal end RESET outputs a low level, and the first transistor M11 is cut off.

To sum up, in the output phase P3, the first signal output end OUTPUT1 applies the gate scanning signals to the gate lines, and the second signal output end OUTPUT2 applies a signal to the signal input end INPUT of the shift register unit RS in the following stage.

As shown in FIG. 4, in a reset phase P4, CLK=0, CLKB=1, INPUT=0 and RESET=1.

A high level is applied to the reset signal end RESET, and the first transistor M11 is cut in. The potential of the pull-up node PU is pulled down to the potential of the third voltage end VSS to reset the pull-up node PU. At this time, the second transistor M2, the third transistor M3 and the fourth transistor M4 are cut off, and the second signal output end OUTPUT2 and the first signal output end OUTPUT1 do not output any scanning signal.

The second clock signal end CLKB outputs a high level and the fifth transistor M5 is cut in, and the high level output by the second clock signal end CLKB is applied to the pull-down node PD. Under a control of the pull-down node PD, the eighth transistor M8, the tenth transistor M10 and the ninth transistor M9 are cut in. At this time, the potential of the pull-up node PU may be pulled down to the potential of the second voltage end VGL through the eighth transistor M8, the potential of the second signal output end OUTPUT2 may be pulled down to the potential of the second voltage end VGL through the tenth transistor M10, and the potential of the first signal output end OUTPUT1 may be pulled down to the potential of the second voltage end VGL through the ninth transistor M9.

In addition, the first clock signal end CLK outputs a high level, the twelfth transistor M12 and the thirteenth transistor M13 are cut in. The potential of the second signal output end OUTPUT2 may be pulled down to the potential of the second voltage end VGL through the twelfth transistor M12, and the potential of the first signal output end OUTPUT1 may be pulled down to the potential of the second voltage end VGL through the thirteenth transistor M13.

Based on this, a low level is input to the signal input end INPUT, and the first transistor M1 is cut off. A low level is input to the first clock signal end CLK, and the sixth transistor M6 is cut off.

Next, prior to the next image frame, the initialization phase P1 may be repeated, so as to the potential of the first signal output end OUTPUT1 and the second signal output end OUTPUT2 may be pulled down to the potential of the second voltage end VGL gradually.

A gate driving circuit is further provided in at least one embodiment of the present disclosure which is configured to apply gate driving signals to gate lines row by row. As shown in FIG. 5, the gate driving circuit includes a plurality of cascaded shift register units (shift register unit RS1, shift register unit RS2, shift register unit RS3 . . . ) hereinabove.

To be specific, a first signal output end OUTPUT1 of the shift register unit RS in each stage is connected to the gate line, to output gate scanning signals to the gate lines.

Excepting the shift register unit RS in a first stage, a second signal output end OUTPUT2 of the shift register unit RS in a current stage is connected to a signal input end INPUT of the shift register unit RS in a following stage.

Excepting the shift register unit RS in a last stage, the second signal output end OUTPUT2 of the shift register unit RS in a current stage is connected to a reset signal end RESET of the shift register unit RS in a previous stage.

The signal input end INPUT of the shift register unit RS1 in the first stage and the reset signal end RESET of the shift register unit RSn in the last stage are connected to an initial signal end STV. In the case that an initialization signal of the initial signal end STV is input to the signal input end INPUT of the shift register unit RS1 in the first stage, the reset signal end RESET of the shift register unit RSn in the last stage may take the initialization signal of the initial signal end STV as a reset signal for resetting the shift register unit RSn in the last stage, or another signal may be input to the reset signal end RESET of the shift register unit RSn in the last stage as a reset signal.

It should be noted that, in order to enable the signal output by the first clock signal end CLK and the second clock signal end CLKB of each shift register unit RS to have the same frequency and amplitude and reverse phases, the first clock signal end CLK and the second clock signal end CLKB of respective shift register unit RSs may be connected to a first system clock signal input end CLK1 and a second system clock signal input end CLK2 alternately.

For example, a first clock signal end CLK of a first shift register RS1 is connected to a first system clock signal input end CLK1, a second clock signal end CLKB of the first shift register RS1 is connected to a second system clock signal input end CLK2; a first clock signal end CLK of a second shift register RS2 is connected to the second system clock signal input end CLK2, a second clock signal end CLKB of the second shift register RS2 is connected to a first system clock signal input end CLK1. The other shift register unit RSs may be arranged in a same way.

A display device including the above gate driving circuit is further provided in at least one embodiment of the present disclosure, which has a structure identical to the above gate driving circuit, and the detailed description thereof is omitted herein.

A method of driving the above shift register units RS is further provided in at least one embodiment of the present disclosure. As shown in FIG. 4, within one frame of image, the method includes the following steps.

As shown in FIG. 4, in a first sub-phase P11 of an initialization phase P1, the reconfiguration circuit 80 pulls down a potential of the first signal output end OUTPUT1 and a potential of the second signal output end OUTPUT2 to a potential of the second voltage end VGL under a control of the second clock signal end CLKB.

To be specific, in the case the circuits of the above shift register unit RS is as shown in FIG. 3 and the transistors in the circuit are N-type transistors, under a control of the second clock signal end CLKB, the twelfth transistor M12 and the thirteenth transistor M13 are cut in, the potential of the second signal output end OUTPUT2 is pulled down to the potential of the second voltage end VGL through the twelfth transistor M12, and the potential of the first signal output end OUTPUT1 is pulled down to the potential of the second voltage end VGL through the thirteenth transistor M13. As such, it is able to reset the potential of the first signal output end OUTPUT1 and the second signal output end OUTPUT2 in the first sub-phase P11 of the initialization phase P1, so as to prevent the remained signal of the previous image frame from interfering the output signal of the current image frame.

In a second sub-phase P12 of the initialization phase P1, a voltage of the first clock signal end CLK is applied to the pull-down node PD through the pull-down control circuit 40 under a control of the first clock signal end CLK, the first pull-down circuit 50 pulls down a potential of the pull-down node PD and a potential of the first signal output end OUTPUT1 to a potential of the second voltage end VGL under a control of the pull-down node PD, and the second pull-down circuit 60 pulls down a potential of the second signal output end OUTPUT2 to the potential of the second voltage end VGL under a control of the pull-down node PD.

To be specific, in the case the circuits of the above shift register unit RS is as shown in FIG. 3 and the transistors in the circuit are N-type transistors, the sixth transistor M6 is cut in under a control of the first clock signal end CLK and a high level output by the first clock signal end CLK is applied to the pull-down node PD, the eighth transistor M8, the ninth transistor M9 and the tenth transistor M10 are cut in under a control of the pull-down node PD. At this time, the potential of the pull-up node PU is pulled down to the potential of the second voltage end VGL through the eighth transistor M8, the potential of the second signal output end OUTPUT2 is pulled down to the potential of the second voltage end VGL through the tenth transistor M10, and the potential of the first signal output end OUTPUT1 is pulled down to the potential of the second voltage end VGL through the ninth transistor M9.

In an input phase P2, the pull-up control circuit 10 outputs a voltage of the first voltage end VDD to the pull-up node PU and stores the voltage of the first voltage end VDD into the second pull-up circuit 30 under a control of the signal input end INPUT.

To be specific, in the case the circuits of the above shift register unit RS is as shown in FIG. 3 and the transistors in the circuit are N-type transistors, a high level is applied to the signal input end INPUT, the first transistor M1 is cut in, a high level of the first voltage end VDD is output to the pull-up node PU, and the high level of the first voltage end VDD is stored by the storage capacitor C.

In an output phase P3 stage, under a control of the pull-up node PU, the first pull-up circuit 20 outputs the voltage of the first clock signal end CLK to the first signal output end OUTPUT1 and the second pull-up circuit 30 outputs the voltage of the first clock signal end CLK to the second signal output end OUTPUT2.

To be specific, in the case the circuits of the above shift register unit RS is as shown in FIG. 3 and the transistors in the circuit are N-type transistors, a low level is applied to the signal input end INPUT and the first transistor M1 is cut off, the potential of the pull-up node PU may be further pulled up due to a bootstrapping of the storage capacitor C. The fourth transistor M4 and the second transistor M2 are cut in under a control of the pull-up node PU. A high level output by the first clock signal end CLK is applied to the second signal output end OUTPUT2 through the fourth transistor M4, to enable the second signal output end OUTPUT2 to output a signal to the signal input end INPUT of the shift register unit RS in a following stage. In addition, the high level output by the first clock signal end CLK is applied to the first signal output end OUTPUT1 through the second transistor M2, and then the third transistor M3 is cut in, so as to apply the high level output by the first clock signal end CLK to the first signal output end OUTPUT1, thereby improving a driving ability of the gate scanning signal output by the first signal output end OUTPUT1.

In a reset phase P4 stage, the reset circuit 70 pulls down a potential of the pull-up node PU to a potential of the third voltage end VSS under a control of the reset signal end RESET, the pull-down control circuit 40 outputs a voltage of the second clock signal end CLKB to the pull-down node PD under a control of the second clock signal end CLKB, the first pull-down circuit 50 pulls down the potential of the pull-up node PU and the potential of the first signal output end OUTPUT1 to the potential of the second voltage end VGL under a control of the pull-down node PD, and the second pull-down circuit 60 pulls down the potential of the second signal output end OUTPUT2 to the potential of the second voltage end VGL under a control of the pull-down node PD.

To be specific, in the case the circuits of the above shift register unit RS is as shown in FIG. 3 and the transistors in the circuit are N-type transistors, a high level is applied to the reset signal end RESET, and the first transistor M11 is cut in. The potential of the pull-up node PU is pulled down to the potential of the third voltage end VSS to reset the pull-up node PU. At this time, the second transistor M2, the third transistor M3 and the fourth transistor M4 are cut off, and the second signal output end OUTPUT2 and the first signal output end OUTPUT1 do not output any scanning signal.

The second clock signal end CLKB outputs a high level and the fifth transistor M5 is cut in, and the high level output by the second clock signal end CLKB is applied to the pull-down node PD. Under a control of the pull-down node PD, the eighth transistor M8, the tenth transistor M10 and the ninth transistor M9 are cut in. At this time, the potential of the pull-up node PU may be pulled down to the potential of the second voltage end VGL through the eighth transistor M8, the potential of the second signal output end OUTPUT2 may be pulled down to the potential of the second voltage end VGL through the tenth transistor M10, and the potential of the first signal output end OUTPUT1 may be pulled down to the potential of the second voltage end VGL through the ninth transistor M9.

In addition, the first clock signal end CLK outputs a high level, the twelfth transistor M12 and the thirteenth transistor M13 are cut in. The potential of the second signal output end OUTPUT2 may be pulled down to the potential of the second voltage end VGL through the twelfth transistor M12, and the potential of the first signal output end OUTPUT1 may be pulled down to the potential of the second voltage end VGL through the thirteenth transistor M13.

Next, prior to the next image frame, the initialization phase P1 may be repeated, so as to the potential of the first signal output end OUTPUT1 and the second signal output end OUTPUT2 may be pulled down to the potential of the second voltage end VGL gradually.

The above are merely the preferred embodiments of the present disclosure. A person skilled in the art may make further modifications and improvements without departing from the principle of the present disclosure, and these modifications and improvements shall also fall within the scope of the present disclosure.

What is claimed is:

1. A shift register unit, comprising a pull-up control circuit, a first pull-up circuit, a second pull-up circuit, a pull-down control circuit, a first pull-down circuit, a second pull-down circuit, a reset circuit and a reconfiguration circuit, wherein the pull-up control circuit is connected to a first voltage end, a signal input end and a pull-up node, and is configured to output a voltage of the first voltage end to the pull-up node under a control of the signal input end;

the first pull-up circuit is connected to a first clock signal end, a first signal output end and the pull-up node, and is configured to output a signal of the first clock signal end to the first signal output end under a control of the pull-up node;

the second pull-up circuit is connected to the first clock signal end, a second signal output end and the pull-up node, and is configured to output the signal of the first clock signal end to the second signal output end under a control of the pull-up node;

the pull-down control circuit is connected to a second clock signal end, the first clock signal end, the pull-up node, a pull-down node and a second voltage end, and is configured to pull down a potential of the pull-down node to a potential of the second voltage end under a control of the pull-up node, or output the signal of the first clock signal end to the pull-down node under a control of the first clock signal end, or output a signal of the second clock signal end to the pull-down node under a control of the second clock signal end;

the first pull-down circuit is directly connected to the pull-down node, the pull-up node, the first signal output end and the second voltage end, and is configured to pull down a potential of the pull-up node and a potential of the first signal output end to the potential of the second voltage end under a control of the pull-down node;

the second pull-down circuit is connected to the pull-down node, the second signal output end and the second voltage end, and is configured to pull down a potential of the second signal output end to the potential of the second voltage end under a control of the pull-down node;

the reset circuit is connected to a reset signal end, the pull-up node, a third voltage end, and is configured to pull down the potential of the pull-up node to a potential of the third voltage end under a control of the reset signal end; and the reconfiguration circuit is connected to the second clock signal end, the second voltage end, the first signal output end and the second signal output end, and is configured to pull down the potential of the first signal output end and the potential of the second signal output end to the potential of the second voltage end under a control of the second clock signal end.

2. The shift register unit according to claim 1, wherein the pull-up control circuit comprises a first transistor, a gate electrode of the first transistor is connected to the signal input end, a first electrode of the first transistor is connected to the first voltage end, and a second electrode of the first transistor is connected to the pull-up node.

3. The shift register unit according to claim 1, wherein the first pull-up circuit comprises a second transistor and a third transistor;
  a gate electrode of the second transistor is connected to the pull-up node, a first electrode of the second transistor is connected to the first clock signal end, and a second electrode of the second transistor is connected to the first signal output end; and
  a gate electrode and a first electrode of the third transistor are connected to the first signal output end, and a second electrode of the third transistor is connected to the first clock signal end.

4. The shift register unit according to claim 1, wherein the second pull-up circuit comprises a fourth transistor and a storage capacitor;
  a gate electrode of the fourth transistor is connected to the pull-up node, a first electrode of the fourth transistor is connected to the first clock signal end, and a second electrode of the fourth transistor is connected to the second signal output end; and
  two ends of the storage capacitor are respectively connected to the fourth transistor and the second signal output end.

5. The shift register unit according to claim 1, wherein the pull-down control circuit comprises a fifth transistor, a sixth transistor and a seventh transistor;
  a gate electrode and a first electrode of the fifth transistor are connected to the second clock signal end, and a second electrode of the fifth transistor is connected to the pull-down node;
  a gate electrode and a first electrode of the sixth transistor are connected to the first clock signal end, and a second electrode of the sixth transistor is connected to the pull-down node; and
  a gate electrode of the seventh transistor is connected to the pull-up node, a first electrode of the seventh transistor is connected to the second voltage end, and a second electrode of the seventh transistor is connected to the pull-down node.

6. The shift register unit according to claim 1, wherein the first pull-down circuit comprises an eighth transistor and a ninth transistor;
  a gate electrode of the eighth transistor is connected to the pull-down node, a first electrode of the eighth transistor is connected to the second voltage end, and a second electrode of the eighth transistor is connected to the pull-up node; and
  a gate electrode of the ninth transistor is connected to the pull-down node, a first electrode of the ninth transistor is connected to the second voltage end, and a second electrode of the ninth transistor is connected to the first signal output end.

7. The shift register unit according to claim 1, wherein the second pull-down circuit comprises a tenth transistor, a gate electrode of the tenth transistor is connected to the pull-down node, a first electrode of the tenth transistor is connected to the second voltage end, and a second electrode of the tenth transistor is connected to the second signal output end.

8. The shift register unit according to claim 1, wherein the reset circuit comprises an eleventh transistor;
  a gate electrode of the eleventh transistor is connected to the reset signal end, a first electrode of the eleventh transistor is connected to the third voltage end, and a second electrode of the eleventh transistor is connected to the pull-up node.

9. The shift register unit according to claim 1, wherein the reconfiguration circuit comprises a twelfth transistor and a thirteenth transistor;
  a gate electrode of the twelfth transistor is connected to the second clock signal end, a first electrode of the twelfth transistor is connected to the second voltage end, and a second electrode of the twelfth transistor is connected to the second signal output end; and
  a gate electrode of the thirteenth transistor is connected to the second clock signal end, a first electrode of the thirteenth transistor is connected to the second voltage end, and a second electrode of the thirteenth transistor is connected to the first signal output end.

10. A gate driving circuit, configured to apply gate driving signals to gate lines row by row and comprising the shift register units according to claim 1 which are connected to each other in a cascaded manner, wherein a first signal output end of the shift register unit in each stage is connected to the gate line;
  excepting the shift register unit in a first stage, a second signal output end of the shift register unit in a current stage is connected to a signal input end of the shift register unit in a following stage;
  excepting the shift register unit in a last stage, the second signal output end of the shift register unit in a current stage is connected to a reset signal end of the shift register unit in a previous stage; and
  the signal input end of the shift register unit in the first stage and the reset signal end of the shift register unit in the last stage are connected to an initial signal end.

11. A display device comprising the gate driving circuit according to claim 10.

12. A method of driving the shift register unit according to claim 1, wherein within one frame of image, the method comprises:
  the reconfiguration circuit pulling down a potential of the first signal output end and a potential of the second signal output end to a potential of the second voltage end under a control of the second clock signal end, in a first sub-phase of an initialization phase;
  outputting a voltage of the first clock signal end to the pull-down node through the pull-down control circuit under a control of the first clock signal end, the first pull-down circuit pulling down a potential of the pull-down node and a potential of the first signal output end to a potential of the second voltage end under a control of the pull-down node, and the second pull-down circuit pulling down a potential of the second signal output end to the potential of the second voltage end under a control of the pull-down node, in a second sub-phase of the initialization phase;
  the pull-up control circuit outputting a voltage of the first voltage end to the pull-up node and storing the voltage of the first voltage end into the second pull-up circuit under a control of the signal input end, in an input phase;
  under a control of the pull-up node, the first pull-up circuit outputting the voltage of the first clock signal end to the first signal output end and the second pull-up circuit outputting the voltage of the first clock signal end to the second signal output end, in an output phase;
  the reset circuit pulling down a potential of the pull-up node to a potential of the third voltage end under a control of the reset signal end, the pull-down control circuit outputting a voltage of the second clock signal end to the pull-down node under a control of the second clock signal end, the first pull-down circuit pulling down the potential of the pull-up node and the potential of the first signal output end to the potential of the second voltage end under a control of the pull-down node, and the second pull-down circuit pulling down the potential of the second signal output end to the potential of the second voltage end under a control of the pull-down node, in a reset phase; and repeating the initialization phase prior to a following frame of image.

13. The method according to claim 12, wherein the reconfiguration circuit comprises a twelfth transistor and a thirteenth transistor; a gate electrode of the twelfth transistor is connected to the second clock signal end, a first electrode of the twelfth transistor is connected to the second voltage end, and a second electrode of the twelfth transistor is connected to the second signal output end; and a gate electrode of the thirteenth transistor is connected to the second clock signal end, a first electrode of the thirteenth transistor is connected to the second voltage end, and a second electrode of the thirteenth transistor is connected to the first signal output end;

wherein the reconfiguration circuit pulling down the potential of the first signal output end and the potential of the second signal output end to the potential of the second voltage end under the control of the second clock signal end in the first sub-phase of the initialization phase comprises:

in the case that transistors of the pull-up control circuit, the first pull-up circuit, the second pull-up circuit, the pull-down control circuit, the first pull-down circuit, the second pull-down circuit, the reset circuit and the reconfiguration circuit are N-type transistors, under a control of the second clock signal end, cutting in the twelfth transistor and the thirteenth transistor, pulling down the potential of the second signal output end to the potential of the second voltage end through the twelfth transistor, and pulling down the potential of the first signal output end to the potential of the second voltage end through the thirteenth transistor.

14. The method according to claim 12, wherein
the pull-down control circuit comprises a sixth transistor, and a gate electrode and a first electrode of the sixth transistor are connected to the first clock signal end, and a second electrode of the sixth transistor is connected to the pull-down node;

the first pull-down circuit comprises an eighth transistor and a ninth transistor, a gate electrode of the eighth transistor is connected to the pull-down node, a first electrode of the eighth transistor is connected to the second voltage end, and a second electrode of the eighth transistor is connected to the pull-up node, and a gate electrode of the ninth transistor is connected to the pull-down node, a first electrode of the ninth transistor is connected to the second voltage end, and a second electrode of the ninth transistor is connected to the first signal output end;

the second pull-down circuit comprises a tenth transistor, a gate electrode of the tenth transistor is connected to the pull-down node, a first electrode of the tenth transistor is connected to the second voltage end, and a second electrode of the tenth transistor is connected to the second signal output end;

wherein the outputting the voltage of the first clock signal end to the pull-down node through the pull-down control circuit under a control of the first clock signal end, the first pull-down circuit pulling down the potential of the pull-down node and the potential of the first signal output end to the potential of the second voltage end under a control of the pull-down node, and the second pull-down circuit pulling down the potential of the second signal output end to the potential of the second voltage end under a control of the pull-down node in the second sub-phase of the initialization phase comprises:

in the case that transistors of the pull-up control circuit, the first pull-up circuit, the second pull-up circuit, the pull-down control circuit, the first pull-down circuit, the second pull-down circuit, the reset circuit and the reconfiguration circuit are N-type transistors, cutting in the sixth transistor under a control of the first clock signal end and applying a high level output by the first clock signal end to the pull-down node, cutting in the eighth transistor, the ninth transistor and the tenth transistor under a control of the pull-down node, pulling down the potential of the pull-up node to the potential of the second voltage end through the eighth transistor, pulling down the potential of the second signal output end to the potential of the second voltage end through the tenth transistor, and pulling down the potential of the first signal output end to the potential of the second voltage end through the ninth transistor.

15. The method according to claim 12, wherein
the pull-up control circuit comprises a first transistor, a gate electrode of the first transistor is connected to the signal input end, a first electrode of the first transistor is connected to the first voltage end, and a second electrode of the first transistor is connected to the pull-up node;

wherein the pull-up control circuit outputting the voltage of the first voltage end to the pull-up node and storing the voltage of the first voltage end into the second pull-up circuit under a control of the signal input end in the input phase comprises:

in the case that transistors of the pull-up control circuit, the first pull-up circuit, the second pull-up circuit, the pull-down control circuit, the first pull-down circuit, the second pull-down circuit, the reset circuit and the reconfiguration circuit are N-type transistors, applying a high level to the signal input end, cutting in the first transistor, outputting a high level of the first voltage end to the pull-up node, and storing the high level of the first voltage end.

16. The method according to claim 12, wherein
the first pull-up circuit comprises a second transistor and a third transistor, a gate electrode of the second transistor is connected to the pull-up node, a first electrode of the second transistor is connected to the first clock signal end, and a second electrode of the second transistor is connected to the first signal output end, and a gate electrode and a first electrode of the third transistor are connected to the first signal output end, and the second electrode of the third transistor is connected to the first clock signal end;

the second pull-up circuit comprises a fourth transistor and a storage capacitor, a gate electrode of the fourth transistor is connected to the pull-up node, a first electrode of the fourth transistor is connected to the first clock signal end, and a second electrode of the fourth transistor is connected to the second signal output end, and two ends of the storage capacitor are respectively connected to the fourth transistor and the second signal output end;

wherein the first pull-up circuit outputting the voltage of the first clock signal end to the first signal output end and the second pull-up circuit outputting the voltage of the first clock signal end to the second signal output end under a control of the pull-up node in the output phase comprises:
in the case that transistors of the pull-up control circuit, the first pull-up circuit, the second pull-up circuit, the pull-down control circuit, the first pull-down circuit, the second pull-down circuit, the reset circuit and the reconfiguration circuit are N-type transistors, applying a low level to the signal input end and cutting off the first transistor;
pulling up the potential of the pull-up node;
cutting in the fourth transistor and the second transistor under a control of the pull-up node;
applying a high level output by the first clock signal end to the second signal output end through the fourth transistor, to enable the second signal output end to output a signal to the signal input end of the shift register unit in a following stage; and
applying the high level output by the first clock signal end to the first signal output end through the second transistor, to cut in the third transistor.

17. The method according to claim 12, wherein
the first pull-up circuit comprises a second transistor and a third transistor, a gate electrode of the second transistor is connected to the pull-up node, a first electrode of the second transistor is connected to the first clock signal end, and a second electrode of the second transistor is connected to the first signal output end, and a gate electrode and a first electrode of the third transistor are connected to the first signal output end, and a second electrode of the third transistor is connected to the first clock signal end;
the second pull-up circuit comprises a fourth transistor and a storage capacitor, a gate electrode of the fourth transistor is connected to the pull-up node, a first electrode of the fourth transistor is connected to the first clock signal end, and a second electrode of the fourth transistor is connected to the second signal output end, and two ends of the storage capacitor are respectively connected to the fourth transistor and the second signal output end;
the reset circuit comprises an eleventh transistor, a gate electrode of the eleventh transistor is connected to the reset signal end, a first electrode of the eleventh transistor is connected to the third voltage end, and a second electrode of the eleventh transistor is connected to the pull-up node;
wherein the reset circuit pulling down a potential of the pull-up node to a potential of the third voltage end under a control of the reset signal end, the pull-down control circuit outputting a voltage of the second clock signal end to the pull-down node under a control of the second clock signal end, the first pull-down circuit pulling down the potential of the pull-up node and the potential of the first signal output end to the potential of the second voltage end under a control of the pull-down node, and the second pull-down circuit pulling down the potential of the second signal output end to the potential of the second voltage end in a reset phase comprises:
in the case that transistors of the pull-up control circuit, the first pull-up circuit, the second pull-up circuit, the pull-down control circuit, the first pull-down circuit, the second pull-down circuit, the reset circuit and the reconfiguration circuit are N-type transistors,
applying a high level to the reset signal end;
cutting in the first transistor; and
pulling down the potential of the pull-up node to the potential of the third voltage end to reset the pull-up node and cut off the second transistor, the third transistor and the fourth transistor.

* * * * *